United States Patent
Tsai et al.

(10) Patent No.: US 8,224,475 B2
(45) Date of Patent: Jul. 17, 2012

(54) METHOD AND APPARATUS FOR ADVANCED PROCESS CONTROL

(75) Inventors: Po-Feng Tsai, Taipei (TW); Andy Tsen, Chung-Ho (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 522 days.

(21) Appl. No.: 12/404,120

(22) Filed: Mar. 13, 2009

(65) Prior Publication Data
US 2010/0234970 A1 Sep. 16, 2010

(51) Int. Cl.
*G05B 13/02* (2006.01)
(52) U.S. Cl. .................... 700/121; 700/108
(58) Field of Classification Search .................. None
See application file for complete search history.

(56) References Cited

U.S. PATENT DOCUMENTS 7,167,766 B2 * 1/2007 Lam et al. ................ 700/96
7,292,906 B2 * 11/2007 Funk et al. ............... 700/121

OTHER PUBLICATIONS

Edgar, Butler, Campbell, Pfeiffer, Bode, Hwang, Balakrishnan, Hahn, "Automatic Control in Microelectronics Manufacturing: Practices, Challenges, and Possibilities", Automatica, vol. 36, 2000, pp. 1567-1603.*
Butler, Stefani, "Rupervisory Run-to-Run Control of Polysilicon Gate Etch Using In Situ Ellipsometry," IEEE Transactions on Semiconductor Manufacturing, vol. 7, No. 2, May 1994, pp. 193-201.*
Pham, Hoang, Ed., "Springer Handbook of Engineering Statistics", Springer, Berlin, 2006, chapter 17, pp. 292.*
Castillo and Rajagopal, "A Multivariate Double EWMA Process Adjustment Scheme for Drifting Processes", IIE Transactions, vol. 34, 2002, pp. 1055-1068.*

* cited by examiner

*Primary Examiner* — Kakali Chaki
*Assistant Examiner* — Walter Hanchak
(74) *Attorney, Agent, or Firm* — Haynes and Boone, LLP

(57) ABSTRACT

A method includes: initializing first and second variables; operating equipment based on the variables; measuring first and second parameters; determining a new value for the first variable based on the first parameter, and calculating a new value for the second variable based on the second parameter and the current value of the second variable; and repeating the operating, measuring, determining and calculating. According to a different aspect, an apparatus includes a computer-readable medium storing a computer program. When executed, the program causes: initializing of first and second variables; operating equipment based on the variables; receiving measured first and second parameters; determining a new value for the first variable based on the first parameter, and calculating a new value for the second variable based on the second parameter and the current value of the second variable; and repeating the operating, measuring, determining and calculating.

20 Claims, 2 Drawing Sheets

METHOD AND APPARATUS FOR ADVANCED PROCESS CONTROL

BACKGROUND

This disclosure relates in general to process control and, more particularly, to techniques for advanced process control.

There are a variety of applications in which processes are carried out under advanced process control (APC). One model for APC is commonly known as analysis of covariance (ANCOVA), and involves a generally linear model with a continuous outcome that is a function of one or more inputs. One example of a specific application for this type of APC is control of equipment used for semiconductor fabrication, such as an etching tool that carries out an etching process on a semiconductor wafer.

In some applications involving multiple inputs for the APC, the inputs may be complex, and may even influence and/or interfere with each other, which can degrade the APC performance. Sometimes, the presence and/or effect of the interaction between inputs is identified and quantified by a human such as an engineer, which can potentially lead to unstable control performance. Consequently, although existing APC techniques have been generally adequate for their intended purposes, they have not been entirely satisfactory in all respects.

SUMMARY

According to one of the broader forms of the invention, a method includes: setting a first variable to an initial value; setting a second variable to an initial value; operating a piece of equipment under advanced process control as a function of each of the first and second variables; thereafter measuring first and second parameters that are different and that each relate to the operation of the equipment; thereafter determining a new value for the first variable as a function of the first parameter, and calculating a new value for the second variable as a function of the second parameter and the current value of the second variable; and thereafter repeating the operating, the measuring, the determining and the calculating.

According to another of the broader forms of the invention, an apparatus includes: a piece of equipment; and a computer operatively coupled to the equipment, the computer including a computer-readable medium that stores a computer program. The computer program, when executed, causes the computer to carry out: setting a first variable to an initial value; setting a second variable to an initial value; operating the equipment under advanced process control as a function of each of the first and second variables; thereafter receiving measured first and second parameters that are different and that each relate to the operation of the equipment; thereafter determining a new value for the first variable as a function of the first parameter, and calculating a new value for the second variable as a function of the second parameter and the current value of the second variable; and thereafter repeating the operating, the measuring, the determining and the calculating.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
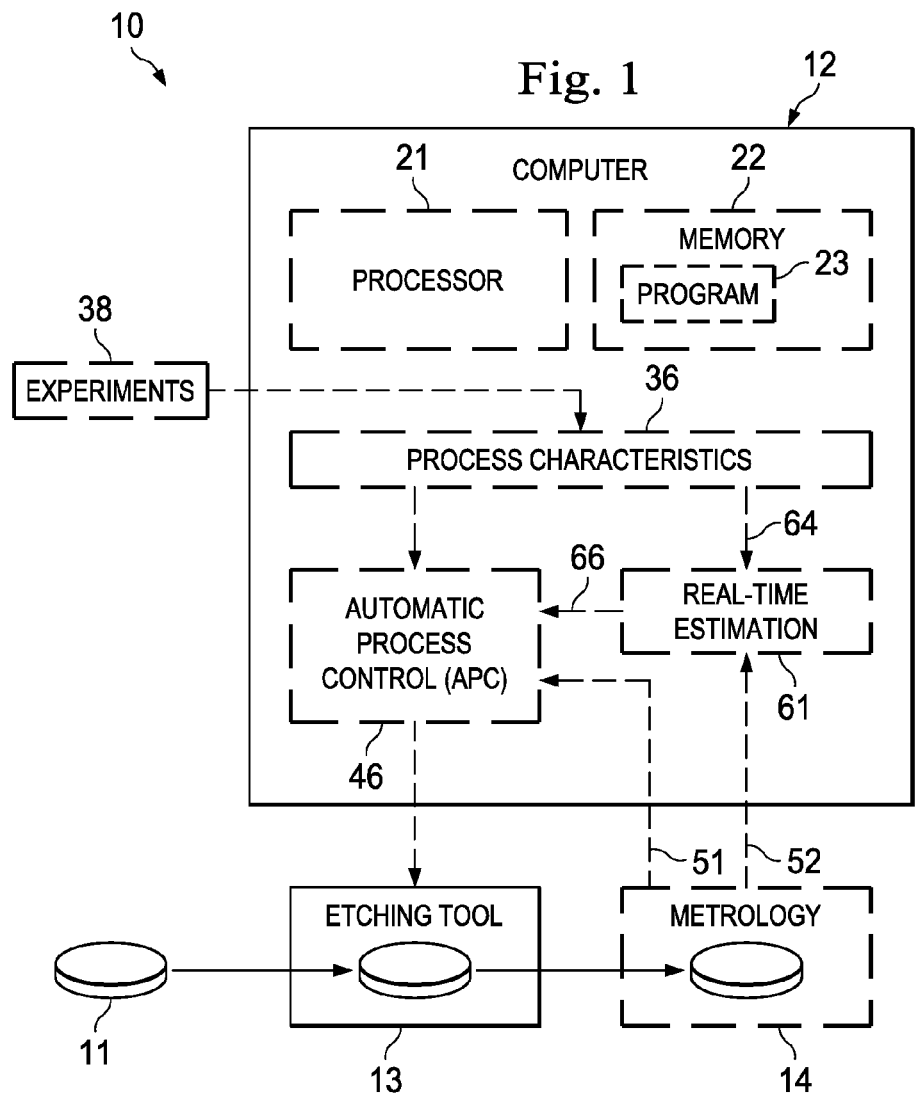
FIG. 1 is a block diagram of an apparatus that is part of a semiconductor fabrication system.

It is to be understood that the following disclosure presents one embodiment, or example, for implementing different features. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed between the first and second features, such that the first and second features may not be in direct contact.

FIG. 1 is a block diagram of an apparatus 10 that is part of a semiconductor fabrication system, and that embodies aspects of the invention. In the disclosed embodiment, the apparatus 10 is used to etch semiconductor wafers, one of which is identified by reference numeral 11. The apparatus 10 includes a computer 12, a piece of equipment that is an etching tool 13, and a metrology section 14. The etching tool 13 is a device of a type known in the art, and includes an etching chamber that is not separately illustrated. A semiconductor wafer is placed in the etching chamber, and then is subjected to an etching process. Thereafter, the wafer (or every Nth wafer) is evaluated in the metrology section 14.

Although FIG. 1 contemplates a metrology section 14 where physical measurements are taken from a wafer, it would alternatively be possible to use virtual metrology techniques of a type known in the art, in order to predict metrology results rather than perform actual physical measurements. As one example of virtual metrology, various characteristics of the etching tool 13 can be determined. Then, the effect on wafers of processing within the etching tool 13 can be predicted, based on factors such as the processing recipe, processing conditions (i.e., settings) and the characteristics of the etching tool. In a variation, real or physical metrology measurements may be reduced for or even replaced by virtual metrology for a period of time, based on factors such as the process quality and product quality.

The computer 12 includes computer hardware that can be a conventional, commercially-available computer, or any other suitable computer hardware. The hardware of the computer 12 includes a processor 21, and a memory 22. The memory 22 stores a computer program 23 that is executed by the processor 21, and that causes the computer 12 to control the etching tool 13. In regard to control of the etching tool 13, the computer 12 includes information representing characteristics of the etching process carried out by the etching tool 13. These process characteristics are represented diagrammatically at 36, and encompass the recipe for the wafer. Some or all of the process characteristics 36 can be predetermined empirically through experiments 38 that are carried out using the etching tool 13. For the etching process carried out by the etching tool 13, the process characteristics would typically include characteristics such as temperature, pressure, chemicals, theoretical or measured etch rate, and so forth. The process characteristics 36 are supplied to a multi-input advanced process control (APC) module 46, which controls the etching tool 13. The APC module 46 is technically part of the program 23 but, for clarity, is shown separately in FIG. 1. The APC module 46 is implemented using an approach that is known in the art, and that is therefore not described in detail here. For example, in the disclosed embodiment, the APC module utilizes an existing technique that is commonly known as analysis of covariance (ANCOVA).

As mentioned above, after wafers have been etched by the etching tool 13, some or all of those wafers 11 are then evaluated in a known manner in the metrology section 14. Information from the evaluation is then supplied back to the computer 12, as indicated diagrammatically at 51 and 52. More specifically, a portion of the metrology information is supplied directly back to the APC module 46, as indicted diagrammatically at 51. Another portion of the metrology information is supplied to a real-time estimation module 61, as indicated diagrammatically at 52. The real-time estimation module 61 is technically part of the program 23 but, for clarity, is shown separately in FIG. 1. The real-time estimation module 61 is discussed in more detail later.

For clarity and convenience, it will be assumed for purposes of the present discussion that the etching process carried out in the etching tool 13 serves to etch a trench or groove into a layer of material at the top of wafer 11, and that one of the parameters measured in the metrology section 14 using known equipment is a depth of the trench. The process characteristics 36 will, of course, be selected with a view to achieving a desired depth for the trench. However, real-world considerations can influence the actual trench depth that is produced by the etching process. For example, characteristics of the part or wafer being etched can affect the trench depth. The extent to which characteristics of the part or wafer 11 cause the trench depth to vary from the intended depth is a depth differential that is represented here by $\alpha_P$. In addition, the etch chamber can influence the etch process. For example, contaminants may build up in the etch chamber over time, and can progressively change the trench depth that is achieved under a given set of control conditions. The extent to which characteristics of the etch chamber cause the trench depth to vary from the intended depth is a depth differential that is represented here by ac.

In the metrology section 14, the trench produced by the etch process carried out in the etching tool 13 is evaluated, including measurement of the actual depth of the trench in a known manner. The metrology information fed back at 52 to the computer 12 includes the measured trench depth, referred to herein as ETCH_DEPTH.

Turning now in more detail to the real-time estimation module 61, the module 61 provides real-time estimation of the actual etch rate that is occurring within the etching tool 13. This is intended to accommodate the fact that, over time, the actual etch rate within the etching tool 13 may vary from the theoretically-expected etch rate, for example due to the effects of the parts ($\alpha_P$), and/or effects of the chamber ($\alpha_C$). The process characteristics 36 include an intended or theoretical etch rate for the etching tool 13, based on all of the process characteristics for the etch process, and this intended etch rate is supplied at 64 to the real-time estimation module 61. The real-time estimation module 61 develops an estimate of the actual etch rate that is currently occurring within the etching tool 13, uses this to calculate an adjusted etch time for the etching process carried out in the etching tool 13, and then provides the updated etch time at 66 to the APC module 46.

For clarity, FIG. 1 and the foregoing discussion indicate that the real-time estimation module 61 estimates an etch rate and then calculates an etch time. Alternatively, however, it would be possible for the real-time estimation module 61 to carry out the estimation of the etch rate and then provide the estimated etch rate to the APC module 46, and for the APC module 46 to then carry out the calculation of an etch time based on the estimated etch rate from the real-time estimation module 61.

Figure 2:
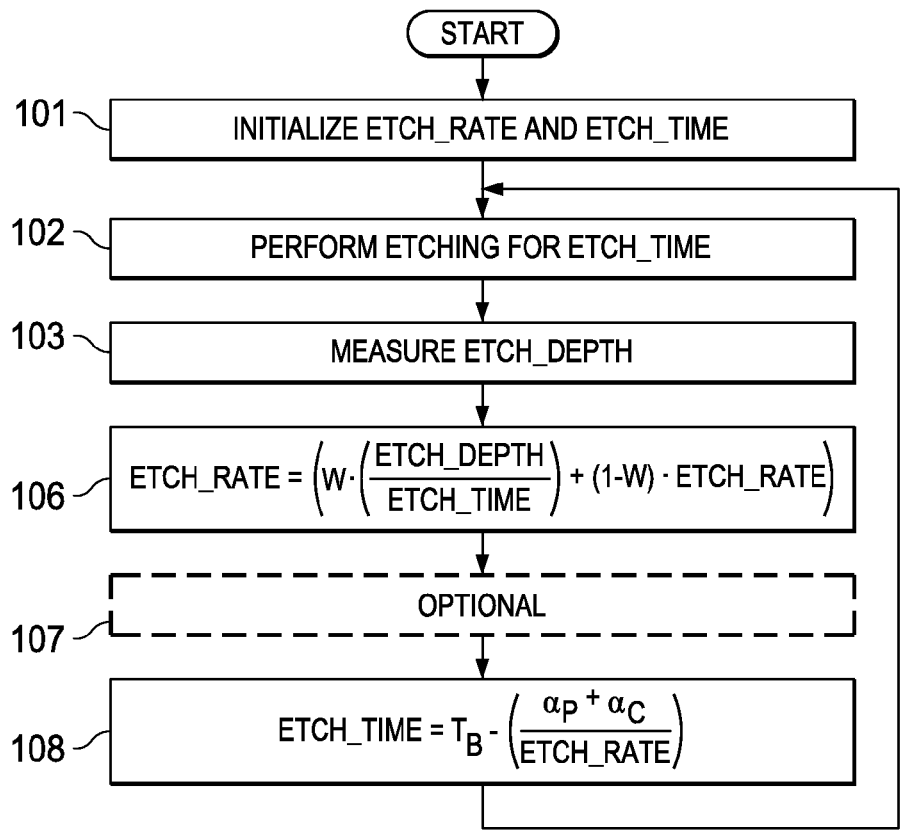
FIG. 2 is a flowchart depicting a portion of a control procedure for an etching tool that is a component of the apparatus of FIG. 1.

FIG. 2 is a flowchart depicting a portion of a control procedure for the etching tool 13, including depiction of what happens within the real-time estimation module 61. In block 101, the real-time estimation module initializes two variables ETCH_RATE and ETCH_TIME, based on information received at 64 (FIG. 1) from the predetermined process characteristics 36. For example, the initialization of both ETCH_RATE and ETCH_TIME may be predetermined by the recipe for the wafer. In the example of FIG. 2, the variable ETCH_TIME is set to a predetermined or baseline etch time $T_B$ from the process characteristics 36. The baseline etch time $T_B$ should theoretically produce a trench with the desired depth under the specific process conditions that have been selected for use within the etching chamber. The value in the variable ETCH_TIME is supplied at 66 to the APC module 46. The variable ETCH_RATE is set to a predetermined etch rate obtained from the process characteristics 36, which is the etch rate that should theoretically occur within the etching tool 13 under the specific process conditions that have been selected for use within the etching chamber.

Thereafter, in block 102, an etching process is carried out on a wafer 11 disposed within the etching tool 13, under control of the APC module 46 and for the period of time specified by the variable ETCH_TIME. That wafer is then transferred from the etching tool 13 to the metrology section 14. Next, as indicated in block 103, the actual depth of the trench in that wafer 11 is measured in a known manner in the metrology section 14, in order to obtain a measured depth value ETCH_DEPTH.

Next, in block 106, the real-time estimation module 61 calculates a new value for the variable ETCH_RATE, using (1) the current value of the variable ETCH_RATE, (2) the trench depth ETCH_DEPTH that was measured in the metrology section 14, and (3) the current value of the variable ETCH_TIME. More specifically, the measured trench depth ETCH_DEPTH is divided by the current value of ETCH_TIME, in order to obtain an actual current etch rate, and this etch rate is then multiplied by a weighting coefficient W, where the coefficient W is a decimal value between 0 and 1, for example 0.5. The weighting coefficient W is subtracted from 1, and the result is multiplied by the current value in the variable ETCH_RATE. These two different weighted values are then added together, in order to obtain a new etch rate value that is stored in the variable ETCH_RATE, replacing the value that had been in ETCH_RATE. Thus, it will be noted that the variable ETCH_RATE always contains a value that is a function of (1) the expected theoretical etch rate from the process characteristics 36, and (2) the calculated etch rates for each of one or more wafers that have been evaluated in the metrology section 14. In effect, the weight given to each etch rate declines progressively over time. Stated differently, at any given point in time, the weights given to etch rates decline progressively, from the most recently calculated etch rate to the predetermined value used to initialize ETCH_RATE.

From block 106, control proceeds to block 107, representing an optional procedure that may or may not be carried out, and that is explained later. From block 107, control proceeds to block 108, where a new value is calculated for the variable ETCH_TIME, based on the new value of the variable ETCH_RATE calculated in block 106. In particular, (1) the known effects of the part and the chamber are collectively represented by a value that corresponds to the sum ($\alpha_p+\alpha_c$), (2) this value is divided by the new value of ETCH_RATE calculated in block 106, and then (3) the result is subtracted from the baseline etch time $T_B$. The result is stored in the variable ETCH_TIME, replacing the value that had been in ETCH_TIME. The new value of ETCH_TIME is supplied at 66 to the APC module 46, for use by the APC module during the next etch process carried out in the etching tool 13. Control then returns to block 102, in order to carry out etching of the next wafer within the etching tool 13. The technique shown in FIG. 2 has the benefit of enhancing APC performance, and reducing interactions between at least some of the multiple inputs to the APC module 46.

Figure 3:
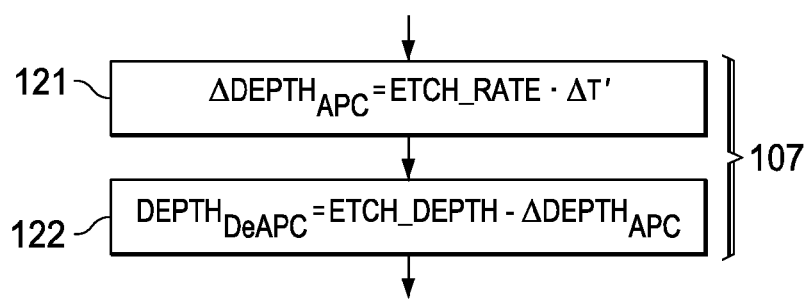
FIG. 3 is a flowchart showing a procedure that can optionally be part of the procedure shown in the flowchart of FIG. 2.

FIG. 3 is a flowchart showing the optional procedure 107 of FIG. 2. Block 121 of FIG. 3 involves calculation of the interaction effect of the output. In particular, the value of ETCH_RATE that was just calculated in block 106 of FIG. 2 is multiplied by a time differential $\Delta T'$, where $\Delta T'$ is:

$$\Delta T' = \left(\frac{\alpha_p + \alpha_c}{\text{ETCH\_RATE}}\right)$$

The result is then placed in a variable $\Delta\text{DEPTH}_{APC}$. Then, in block 122, the interaction effect in the output is removed. In particular, the calculated value of $\Delta\text{DEPTH}_{APC}$ is subtracted from the measured etch depth ETCH_DEPTH, and the result is placed in a variable $\text{DEPTH}_{DeAPC}$. The two variables $\Delta\text{DEPTH}_{APC}$ and $\text{DEPTH}_{DeAPC}$ are not used in the procedure shown in FIG. 2. However, they can optionally be calculated in block 107 for other purposes. For example, the value $\text{DEPTH}_{DeAPC}$ can be calculated to indicate what the trench depth would be if there was no effort to compensate for varying etch conditions. The value $\text{DEPTH}_{DeAPC}$ may be used in a variety of applications, for example for sampling policy simulations and optimizations, where it is necessary to remove APC effects and restore wafer data to the state that it had before processing, in order to simulate the control performance under different sampling policies. Once the effects of APC are removed, factors that influence the results but that were suppressed by the APC will be clearer, and can be more easily identified.

Although the embodiment discussed above involves APC control of an etching tool in a semiconductor fabrication process, it would alternatively be possible to use the disclosed technique to control some other aspect of a semiconductor fabrication process, or to control a process in an application other than semiconductor fabrication. Although the disclosed embodiment uses an estimated etch rate to fine-tune an etch time, it would alternatively be possible to use the estimated etch rate for other purposes. For example, the measured etch depth could be divided by the estimated etch rate in order to obtain a time adjustment to be made to a baseline polish time. As another example, it would alternatively be possible for the real-time estimation module 61 to provide an estimate of some parameter other than etch rate, relating to some other input of a multi-input APC module.

Although one embodiment has been illustrated and described in detail, persons skilled in the art should understand that they may make various changes, substitutions and alterations without departing from the spirit and scope of the present disclosure. In this regard, one of the broader forms of the invention involves a method that includes: setting a first variable to an initial value; setting a second variable to an initial value; operating a piece of equipment under advanced process control as a function of each of the first and second variables; thereafter measuring first and second parameters that are different and that each relate to the operation of the equipment; thereafter determining a new value for the first variable as a function of the first parameter, and calculating a new value for the second variable as a function of the second parameter and the current value of the second variable; and thereafter repeating the operating, the measuring, the determining and the calculating.

In another form, the calculating includes: multiplying the second parameter by a first weight to obtain a first weighted value, multiplying the current value of the second variable by a second weight to obtain a second weighted value, and then adding the first and second weighted values.

Another form includes selecting as the first weight a value between 0 and 1, and selecting as the second weight a value that is 1 minus the first weight.

In another form the operating of the equipment includes processing of a semiconductor wafer under the advanced process control.

In another form, the operating of the equipment includes performing with the equipment under the advanced process control an etching procedure in relation to a semiconductor wafer.

In another form, the measuring of the second parameter includes measuring a thickness of material removed by the etching procedure.

In another form, the second variable represents an etch rate, and the calculating of the new value for the second variable includes dividing the second parameter by a duration of the etching procedure.

In another form, the operating of the equipment includes adjusting a duration of the etching procedure as a function of the second value.

According to another of the broader forms of the invention, An apparatus includes a piece of equipment; and a computer operatively coupled to the equipment, the computer including a computer-readable medium storing a computer program. The computer program, when executed, causes the computer to carry out: setting a first variable to an initial value; setting a second variable to an initial value; operating the equipment under advanced process control as a function of each of the first and second variables; receiving thereafter measured first and second parameters that are different and that each relate to the operation of the equipment; determining thereafter a new value for the first variable as a function of the first parameter, and calculating a new value for the second variable as a function of the second parameter and the current value of the second variable; and repeating thereafter the operating, the measuring, the determining and the calculating.

According to another form, the computer program carries out the calculating in manner that includes: multiplying the second parameter by a first weight to obtain a first weighted value, multiplying the current value of the second variable by a second weight to obtain a second weighted value, and then adding the first and second weighted values.

In another form, the computer program carries out the calculating in a manner that includes using as the first weight a value between 0 and 1, and using as the second weight a value that is 1 minus the first weight.

In another form, the equipment processes a semiconductor wafer under the advanced process control.

In another form, the equipment performs under the advanced process control an etching procedure in relation to a semiconductor wafer.

In another form, the second parameter represents a measured thickness of material removed by the etching procedure.

In another form, the second variable represents an etch rate, and the computer program carries out the calculating of the new value for the second variable in a manner that includes dividing the second parameter by a duration of the etching procedure.

According to another form, the computer program carries out the operating of the equipment in a manner that includes adjusting a duration of the etching procedure as a function of the second value.

The foregoing has outlined features of one embodiment. Persons skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations to what is disclosed herein, without departing from the spirit and scope of the present disclosure.

What is claimed is:

1. A method comprising:
setting a first variable to a baseline operation time; setting a second variable to a theoretical operation rate; operating a piece of equipment under advanced process control as a function of each of the first and second variables; thereafter measuring first and second parameters that are different and that each relate to the operation of the equipment; calculating an actual rate achieved during the operating, the actual rate being a function of the second parameter and the first variable, wherein the calculating of the actual rate includes dividing the second parameter by the first variable; calculating a new value for the second variable as a function of the actual rate and the current value of the second variable; calculating a new value for the first variable as a function of the baseline operation time and the new value for the second variable; and thereafter repeating the operating, the measuring, the calculating the actual rate, the calculating the new value for the second variable, and the calculating the new value for the first value.

2. A method according to claim 1, wherein the calculating the new value for the second variable includes: multiplying the actual rate by a first weight to obtain a first weighted value, multiplying the current value of the second variable by a second weight to obtain a second weighted value, and then adding the first and second weighted values.

3. A method according to claim 2, including: selecting as the first weight a value between 0 and 1, and selecting as the second weight a value that is 1 minus the first weight.

4. A method according to claim 1, wherein the operating the equipment includes processing of a semiconductor wafer under the advanced process control.

5. A method according to claim 1, wherein the operating the equipment includes performing with the equipment under the advanced process control an etching procedure in relation to a semiconductor wafer.

6. A method according to claim 5, wherein the measuring of the second parameter includes measuring a thickness of material removed by the etching procedure.

7. A method according to claim 6,
wherein the first variable represents an etch time;
wherein the second variable represents an etch rate; and
wherein the actual rate represents an actual etching rate achieved during the etching procedure.

8. A method according to claim 7, wherein the operating the equipment includes adjusting a duration of the etching procedure as a function of the new value for the first variable.

9. An apparatus comprising:
a piece of equipment; and a computer operatively coupled to the equipment, the computer including a computer-readable medium storing a computer program that, when executed, causes the computer to carry out: setting a first variable to a baseline operation time; setting a second variable to a theoretical operation rate; operating the equipment under advanced process control as a function of each of the first and second variables; receiving thereafter measured first and second parameters that are different and that each relate to the operation of the equipment; calculating an actual rate achieved during the operating, the actual rate being a function of the second parameter and the first variable, wherein calculating the actual rate includes dividing the second parameter by the first variable; calculating a new value for the second variable as a function of the actual rate and the current value of the second variable; calculating a new value for the first variable as a function of the baseline operation time and the new value for the second variable; and repeating thereafter the operating, the receiving, the calculating the actual rate, the calculating the new value for the second variable, and the calculating the new value for the first value.

10. An apparatus according to claim 9, wherein the computer program further carries out the calculating a new value for the second variable in manner that includes:
multiplying the actual rate by a first weight to obtain a first weighted value;
multiplying the current value of the second variable by a second weight to obtain a second weighted value; and
adding the first and second weighted values.

11. An apparatus according to claim 10, wherein the computer program further carries out the calculating in a manner that includes using as the first weight a value between 0 and 1, and using as the second weight a value that is 1 minus the first weight.

12. An apparatus according to claim 9, wherein the equipment processes a semiconductor wafer under the advanced process control.

13. An apparatus according to claim 9, wherein the equipment performs under the advanced process control an etching procedure in relation to a semiconductor wafer.

14. An apparatus according to claim 13, wherein the second parameter represents a measured thickness of material removed by the etching procedure.

15. An apparatus according to claim 14,
wherein the first variable represents an etch time;
wherein the second variable represents an etch rate; and
wherein the actual rate represents an actual etching rate achieved during the etching procedure.

16. An apparatus according to claim 15, wherein the computer program further carries out the operating of the equipment in a manner that includes adjusting a duration of the etching procedure as a function of the new value for the first variable.

17. A method comprising:
determining a theoretical etch rate for an etching process to be carried out by an etching tool under advanced process control;
determining a baseline etch time for the etching process;
carrying out the etching process with the etching tool as a function of the theoretical etch rate and the baseline etch time;
measuring, after the carrying out the etching process, an etch depth of a trench formed by the etching process;

calculating an actual etch rate achieved during the carrying out the etching process, the actual etch rate being a function of the etch depth and a duration of the etching process, wherein the calculating the actual rate includes dividing the etch depth by the duration of the etching process;

calculating an updated etch rate for a subsequent etching process as a function of the actual etch rate and the theoretical etch rate;

calculating an updated etch time for a subsequent etching process as a function of the baseline etch time and the updated etch rate; and carrying out the etching process with the etching tool a subsequent time as a function of the updated etch rate and the updated etch time.

18. A method according to claim 17, wherein the calculating an updated etch rate includes multiplying the actual etch rate by a first weight to obtain a first weighted value, multiplying the theoretical etch rate by a second weight to obtain a second weighted value, and then adding the first and second weighted values.

19. A method according to claim 18, including: selecting as the first weight a value between 0 and 1, and selecting as the second weight a value that is 1 minus the first weight.

20. A method according to claim 17, wherein the calculating the updated etch time includes taking into account characteristics of the etching tool and an etch chamber that cause the etch depth to vary from an intended etch depth.

\* \* \* \* \*